United States Patent
Kodera et al.

(10) Patent No.: US 6,852,655 B2
(45) Date of Patent: Feb. 8, 2005

(54) DIELECTRIC CERAMIC

(75) Inventors: Eiji Kodera, Nagoya (JP); Kazuyuki Fujii, Nagoya (JP); Makoto Baba, Nagoya (JP); Hidetoshi Mizutani, Nagoya (JP); Manabu Sato, Nagoya (JP)

(73) Assignee: NGK Spark Plug Co., Ltd., Aichi (JP)

( * ) Notice: Subject to any disclaimer, the term of this patent is extended or adjusted under 35 U.S.C. 154(b) by 176 days.

(21) Appl. No.: 10/354,074

(22) Filed: Jan. 30, 2003

(65) Prior Publication Data

US 2003/0216240 A1 Nov. 20, 2003

(30) Foreign Application Priority Data

| May 20, 2002 | (JP) | ................................ P. 2002-145406 |
| May 20, 2002 | (JP) | ................................ P. 2002-145407 |
| May 20, 2002 | (JP) | ................................ P. 2002-145408 |
| May 20, 2002 | (JP) | ................................ P. 2002-145409 |

(51) Int. Cl.$^7$ ............................................. C03C 1/00
(52) U.S. Cl. .................................... 501/32; 501/79
(58) Field of Search ................................. 501/32, 79

(56) References Cited

U.S. PATENT DOCUMENTS

| 2,010,836 | A |   | 8/1935  | Douglas et al. |        |
| 4,624,934 | A | * | 11/1986 | Kokubu et al.  | 501/17 |
| 5,763,339 | A | * | 6/1998  | Asada et al.   | 501/17 |
| 6,448,195 | B2| * | 9/2002  | Kishida et al. | 501/32 |

FOREIGN PATENT DOCUMENTS

| JP | 53-60914   |   | 5/1978 |          |
| JP | 55-113641  | * | 9/1980 | C03C/3/30|
| JP | 60-235744  |   | 11/1985|          |
| JP | 63-239892  |   | 10/1988|          |
| JP | 03-33026   |   | 2/1991 |          |
| JP | 7-135379   |   | 5/1995 |          |
| JP | 9-208258   |   | 8/1997 |          |

OTHER PUBLICATIONS

Patent Abstracts of Japan—03033026, vol. 015, No. 163 (1991).
Patent Abstracts of Japan—55113641, vol. 004, No. 173 (1980).
Patent Abstracts of Japan—02212336, vol. 014, No. 509 (1990).
Patent Abstracts of Japan—2003112971, vol. 2003, No. 8 (2003)(Apr.).
Patent Abstracts of Japan—2003112972, vol. 2003, No. 8 (2003)(Apr.)
European Search Report dated Sep. 19, 2003.

* cited by examiner

Primary Examiner—David Brunsman
(74) Attorney, Agent, or Firm—Sughrue Mion, PLLC

(57) ABSTRACT

The invention is to offer such a dielectric ceramic enabling to simultaneously sinter with the low resistant conductor of Ag based metals and Cu based metals, having the excellent mechanical strength and exhibiting the excellent dielectric characteristics in the GHz zone. Mixed powders of Si: 20 to 30 weight %, B: 5 to 30 weight %, Al: 20 to 30 weight %, Ca: 10 to 20 weight %, and Zn: 10 to 20 weight % are prepared, melted, and rapidly cooled to produce glass frits. The glass frits are granulated and mixed with gahnite filler and titania filler which are inorganic filler powders. Subsequently, a binder is thrown into the powders to produce a composition of dielectric ceramic, and then is formed, followed by sintering. The mixed powders may contain at least one kind of alkali metal of Li, K and Na.

41 Claims, No Drawings

DIELECTRIC CERAMIC

BACKGROUND OF THE INVENTION

1. Field of the Invention

The present invention relates to a dielectric ceramic (also called as "dielectric material" or "dielectric sintered body", and in the present-description, called as "dielectric ceramic" hereafter), and in more particular, relates to such a dielectric ceramic excellent in sintering property at low temperatures and mechanical strength, and having excellent dielectric characteristics in GHz zone. The dielectric ceramic of the invention is broadly applicable as electronic parts. In particular, this is suited as electronic parts, wiring substrate mounting electronic parts thereon, among them multi-wiring substrates formed in multi-layers, and further as electronic parts for high frequency used in GHz zones, packages therefor or multi-wiring substrates (multi-layer wiring substrates or boards).

2. Description of the Related Art

The dielectric ceramic has conventionally been employed as various kinds of electronic parts or wiring substrates mounting them thereon. The dielectric ceramic used to such services has been demanded to be capable of being sintered at low temperatures as 1000° C. and have large mechanical strength. The dielectric ceramic having satisfied these requirements has mainly been made of glasses and an inorganic filler (the glasses: glass powder of softening point being about 500 to 800° C. and containing lead oxide, alkali earth metal oxide, alkali metal oxide and zinc oxide based on aluminoborosilicate) and (the inorganic filler: alumina, mullite, cordierite, titanic, forsterite, zirconia and quartz).

Such dielectric ceramics are disclosed in JP-A-53-60914, JP-A-60-235744, JP-A-63-239892, JP-A-3-33026, JP-A-7-135319 and JP-A-9-208258. Dielectric loss of these dielectric ceramics is $6 \times 10^{-4}$ to $20 \times 10^{-4}$ in MHz.

In recent years, it has particularly been demanded that the dielectric loss is small in the increasingly used GHz zone. Therefore, required dielectric ceramics are those which can be sintered simultaneously with low resistant conductors of Ag based metals and Cu based metals, are high in the mechanical strength, and less in warp, curve or camber (in this specification, it is sometimes simply referred to as warp) in sintered products (the less warp makes dimensional stability good, and can suppress transmission loss during using in the GHz zone).

However, it has been difficult to accomplish at the same ime the excellent sintering property at low temperatures and the mechanical strength, and the excellent dielectric characteristics in the GHz zone.

SUMMARY OF THE INVENTION

The invention is to solve the above mentioned problems, and accordingly it is an object of the invention to offer such a dielectric ceramic enabling to simultaneously sinter with the low resistant conductor of Ag based metals and Cu based metals, having the excellent mechanical strength and exhibiting the excellent dielectric characteristics in the GHz zone.

(1) The dielectric ceramic of the invention contains an inorganic filler and glass, and is characterized in that, in case a total of the inorganic filler and the glass is 100 mass % (i.e., weight %), it contains the inorganic filler of 20 to 60 mass % and the glass of 40 to 80 mass %, and in case the whole of the glass is 100 mass %, it contains, in terms of oxides respectively, Si: 20 to 30 mass %, B: 5 to 30 mass %, Al: 20 to mass %, Ca: 10 to 20 mass %, Zn: 10 to 20 mass %, and containing least one kind of alkali metal: 0.2 to 5 mass % in total of Li, Na and K.

Further, the dielectric ceramic of the invention can make it possible that dielectric loss at 3 GHz is $50 \times 10^{-4}$ or less, that relative dielectric constant at 3 GHz is 6 to 13, still further that coefficient of thermal expansion at 25 to 400° C. is 5 to 10 ppm/° C., and yet further that bending strength (or flexural strength) is 185 MPa or more.

(2) The dielectric ceramic of the invention is made by sintering at 1000° C. or lower a composition for the dielectric ceramic (i.e., a dielectric ceramic composition) containing an inorganic filler and glass, and is characterized in that, in case a total of the inorganic fillers and the glasses is 100 mass %, it contains the inorganic filler of 20 to 60 mass % and the glass of 40 to 80 mass %, and in case the whole of the glass is 100 mass %, it contains, in terms of oxides respectively, Si: 20 to 30 mass %, B: 5 to 30 mass %, Al: 20 to 30 mass %, Ca: 10 to 20 mass %, Zn: 10 to 20 mass %, and containing at least one kind of alkali metal: 0.2 to 5 mass % in total of Li, Na and K.

(3) The dielectric ceramic of the invention contains an inorganic filler and glass, and is characterized in that, in case a total of the inorganic filler and the glass is 100 mass %, it contains the inorganic filler of 20 to 60 mass % and the glass of 40 to 80 mass %, and in case the whole of the glass is 100 mass %, it contains, in terms of oxides respectively, Si: 20 to 30 mass %, B: 5 to 30 mass %, Al: 20 to 30 mass %, Ca: 10 to 20 mass %, Zn: 10 to 20 mass %, and contains neither Li, Na nor K.

(4) The dielectric ceramic of the invention is made by sintering at 1000° C. or lower a composition for the dielectric ceramic containing an inorganic filler and glass, and is characterized in that, in case a total of the inorganic filler and the glass is 100 mass %, it contains the inorganic filler of 20 to 60 mass % and the glass of 40 to 80 mass %, and in case the whole of the glass is 100 mass %, it contains, in terms of oxides respectively, Si: 20 to 30 mass %, B: 5 to 30 mass %, Al: 20 to 30 mass %, Ca: 10 to 20 mass %, Zn: 10 to 20 mass %, and contains neither Li, Na nor K.

The dielectric ceramic of the invention can make it possible that dielectric loss in 3 GHz is $50 \times 10^{-4}$ or less. The dielectric ceramic of the invention can make it possible that relative dielectric constant in 3 GHz is 6 to 13.

The dielectric ceramic of the invention can make it possible that coefficient of thermal expansion at 25 to 400° C. is 5 to 10 ppm/° C.

The dielectric ceramic of the invention can make it possible that bending strength is 185 MPa or more.

The inorganic filler can contain a gahnite filler (a filler composed of gahnite) and a titania filler (a filler composed of titania).

The difference between the glass transition point Tg and a bending point Mg can be 30 to 45° C.

According to the dielectric ceramic of the invention, it is possible to provide such dielectric characteristic enabling to simultaneously sinter with the low resistant conductor of Ag based metals and Cu based metals, having the excellent mechanical strength and exhibiting the excellent dielectric characteristic.

DETAILED DESCRIPTION OF THE INVENTION

Reference will be made in detailed to the invention.

The above mentioned "inorganic filler" can change dielectric characteristics and mechanical characteristics of the dielectric ceramic, depending on kinds and containing amounts. As qualities of materials composing the inorganic filler, there may listed, for example, gahnite, titania, alumina, titanate (magnesium titanate, calcium titanate, strontium titanate, barium titanate), mullite, zirconia, quartz, cordierite, forsterite, wallastonite, anorthite, enstatite, diopside, akermanite, gehlenite and spinel. Among them, enabling to make relative dielectric constant (called as briefly "$\epsilon r$" hereafter) large in a high frequency zone (in particular, GHz zone), gahnite, titania, titanate, and alumina are desirable. Enabling to make mechanical strength improved, gahnite, titania, ziroconia, and alumina are desirable. These may be one kind or more than two kinds.

For respectively adjusting the characteristics (dielectric characteristic and mechanical strength) of the dielectric ceramic, more than two kinds may be combined. For example, among the dielectric characteristics, for controlling temperature dependency (called briefly as "$\tau f$" hereafter) of resonance frequency in the high frequency (especially the GHz zone) to be low (controlling an absolute value of $\tau f$ to be small), it is possible to employ the inorganic filler having $\tau f$ of negative value and the inorganic filler of a positive value. The combination thereof may list gahnite+titania, gahnite+titanate, alumina+titanate, and gahnite+alumina+titanate.

Of them, the combination of gahnite filler and titania filler displays the enough mechanical strength and can obtain large $\epsilon r$ in the high frequency zone (GHz zone) and $\tau f$ of a small absolute value.

In case a total of the inorganic filler and the glass is 100 mass %, the inorganic filler is contained 20 to 60 mass % (more preferably, 30 to 60 mass %, and still more preferably, 40 to 55 mass %). Being less than 20 mass %, the glass melts out to probably react with a sintering jig, or a sufficient bending strength might not be effected. On the other hand, exceeding 60 mass %, the sintering below 1000° C. may be difficult, and the simultaneously sintering with the low resistant conductor could not probably be accomplished.

In case the gahnite filler and the titania filler are used in combination, the total amount of the gahnite filler and the titania filler occupying the whole of the inorganic filler is preferably 50 mass t or more (more preferably 80 mass %, still more preferably 90 mass %, and even 100 mass % is permitted). Being less than 50 mass %, an effect of containing the gahnite filler and the titania filler is not enough displayed.

As to the amount mT (in terms of the mass (i.e., weight)) of containing the titania filler to the amount mG (in terms of the mass) of containing the gahnite filler, the ratio of mT/mG is preferably 0.1 to 1.5, more preferably 0.4 to 1.0, yet preferably 0.6 to 0.9. Being less than 0.1, an effect of suppressing the absolute value of $\tau f$ to be small is difficult to obtain.

Configurations (shapes) of the inorganic filler are not especially limited, and for example, various configurations such as particulate, scaly, or fabric (especially, whisker) ones may be sufficient. Ordinarily, sizes are desirably 1 to 10 $\mu m$ (in case of a particulate one, an average diameter is employed). Being over 10 $\mu m$, the structure of the dielectric ceramic trends to exceedingly become rough. Being less than 1 $\mu m$, production is probably difficult, though giving no influences to characteristics of the dielectric ceramic.

The inorganic filler is present in the dielectric ceramic as having configurations and sizes added as the inorganic filler powders when producing the dielectric ceramic, including those which are added as glass powders when producing and precipitated as crystalline elements (anorthite, spinel, and gahnite).

The above mentioned "glass" can change the sintering temperatures and dielectric characteristic of the dielectric ceramic, depending on kinds and containing amounts. In case a total amount of the inorganic filler and the glass is 100 mass %, the glass is 40 to 80 mass % (more preferably, 40 to 70 mass %, and still more preferably 50 to 60 mass 1). If the glass is less than 40 mass %, it is difficult to decrease the sintering temperature below 1000° C., while exceeding 80 mass %, the mechanical strength goes down, and the dielectric characteristic is not sufficient in the high frequency zone, either. In particular, $\epsilon r$ is undesirably small.

In case the glass in one embodiment of the invention contains alkali metal element, the glass contains at least Si element, B element, Al element, Ca element and Zn element, and at least one kind of alkali metal element (called briefly as "X" hereafter) of Li element, Na element and K element. No limitation is especially made to what compounds these elements are contained in the glass.

In case the glass in one embodiment of the invention contains alkali metal element, the above mentioned "in terms of oxide" is irrespective of what compounds Si, B, Al, Ca and Zn, and X exist in the glass, and Si is calculated as $SiO_2$, B is calculated as $B_2O_3$, Al is calculated as $Al_2O_3$, Ca is done as CaO, Zn is done as ZnO, and X is calculated as $X_2O$.

In case the glass in one embodiment of the invention does not contain alkali metal element, the glass contains at least Si element, B element, Al element, Ca element and Zn element. No limitation is especially made to what compounds these elements are contained in the glass.

In case the glass in one embodiment of the invention does not contain alkali metal element, the above mentioned "in terms of oxide" is irrespective of what compounds Si, B, Al, Ca and Zn, and Si is calculated as $SiO_2$, B is calculated as $B_2O_3$, Al is calculated as $Al_2O_3$, Ca is done as CaO, Zn is done as ZnO.

In case the whole of glass is 100 mass %, Si is 0.20 to 30 mass % in terms of oxide (more preferably 20 to 27%, still more preferably 21 to 25 mass %). Being less than 20 mass %, a softening temperature of the glass is too low, and the simultaneously sintering property with the low resistant conductor is not sufficient to probably cause warp undesirably, and besides $\epsilon r$ might be undesirably large. On the other hand, being over 30 mass %, $\epsilon r$ may be a moderate value, but since the sintering temperature becomes high, the simultaneously sintering with a low resistant wire might be difficult. On the other hand, it is possible to increase a compounding rate of the glass component for sintering, but in turn the dielectric loss undesirably over increases.

B is 5 to 30 mass % in terms of oxide. Being less than 5 mass %, temperature enabling to sinter is too high, and the simultaneously sintering property with the low resistant conductor is not enough, frequently causing the warp undesirably. On the other hand, being over 30 mass %, the glass softening temperature becomes too low, and the simultaneously sintering property with the low resistant conductor is not enough, causing the warp. Besides, chemical stability of the glass in the dielectric ceramic goes down, so that undesirably chemical resistance is not enough obtained.

By containing B 10 to 30 mass %, the sintering temperature can be adjusted in a wide range of 750 to 950° C. when producing. Further, by containing 15 to 30 masse, in addition to the above, the simultaneously sintering property with the low resistant conductor is made especially favorable, enabling to effectively avoid the warp occurring. By containing 20 to 30 mass %, in addition to the above, the chemical resistance of the dielectric ceramic becomes especially high, and for example, in a plating process when producing the multi-layer wiring substrate, the dielectric ceramic can be effectively avoided from melting and erosion.

Furthermore, the amount of Al is 20 to 30 mass % in terms of oxide (more preferably 21 to 29 mass %, and still more preferably 22 to 26 mass %). Being less than 20 mass %, the mechanical strength of the dielectric ceramic is not enough obtained, and in particular, being less than 10 mass %, the glass stability is undesirably spoiled. On the other hand, exceeding 30 mass %, the temperature enabling to sinter is too high and is not undesirable.

The amount of Ca is 10 to 20 mass % in terms of oxide (more preferably 12 to 20 mass %, and still more preferably 15 to 18 mass %). Being less than 10 mass %, undesirably a melting property of the glass is not enough heightened. On the other hand, exceeding 20 mass %, the coefficient of thermal expansion becomes undesirably too large.

The amount of Zn is 10 to 20 mass % in terms of oxide (more preferably 10 to 18 mass %, and still more preferably 11 to 16 mass %). Being less than 10 mass %, the simultaneously sintering property with the low resistant conductor is not enough, causing the warp undesirably. On the other hand, being over 20 mass %, undesirably the chemical resistance of the dielectric ceramic is not enough obtained.

In case the glass in one embodiment of the invention contains the alkali metal element, the amount of X is 0.2 to 5 mass % in terms of oxide. Being less than 0.2 mass %, the glass transition point is probably too high and the sintering property might be undesirably spoiled. On the other hand, exceeding 5 mass %, the glass transition point probably goes down, so that only the glass is undesirably over sintered.

It is sufficient that X falls within the above range owing to at least any of Li, Na and K. But if using Ag based metal as the low resistant conductor to the multi-wiring substrate, it is desirable not to contain Li. Thereby, occurrence of migration of Ag can be very effectively suppressed.

The fact of "In case the glass in one embodiment of the invention does not contain the alkali metal element" signifies that Li, Na and K are not substantially contained in the glass. That is, there is a chance that these elements are not positively contained, but inevitably contained. In such a case, desirable is a degree that influences effected by Li, Na and K contained do not appear, in other words, if the whole of glass is 100 mass %, they are preferably less than 0.2 masse (more preferably, not containing them). In case of using Ag based metals as the low resistant conductor to the multi-wiring substrate, if the occurrence of the Ag migration is in particular concerned as a distance between adjacent wires is very short, or thickness of an insulating layer or an insulating ceramic layer (in the present specification, it is sometimes simply referred to as an insulating layer) is very thin, it is preferable to use the glass containing no alkali metal.

Preferable contents in terms of oxide of these elements may be respectively combined. That is, for example:—

In case the glass in one embodiment of the invention contains the alkali metal element, it is possible that Si is 20 to 27 mass %, B is 10 to 30 mass %, Al is 21 to 29 mass %, Ca is 12 to 20 mass %, Zn is 10 to 18 mass %, and X is 0.2 to 5 mass %. Further, it is possible that Si is 21 to 25 mass %, B is 15 to 30 mass %, Al is 22 to 26 mass %, Ca is 15 to 18 mass %, Zn is, 11 to 16 mass %, and X is 0.2 to 5 mass %.

In case the glass in one embodiment of the invention does not contain the alkali metal element, for example, it is possible that Si is 20 to 27 mass %, B is 10 to 30 mass %, Al is 21 to 29 mass %, Ca is 12 to 20 mass %, and Zn is 10 to 18 mass %. Further, it is possible that Si is 21 to 25 mass %, B is 15 to 30 mass %, Al is 22 to 26 mass %, Ca is 15 to 18 mass %, and Zn is 11 to 16 masse.

According to the dielectric ceramic of the invention, it is possible that the dielectric loss in 1 to 15 GHz (in particular 3 to 10 GHz) is $50 \times 10^{-4}$ or less, (further, $40 \times 10^{-4}$ or less, especially $30 \times 10^{-4}$ or less, and normally $20 \times 10^{-4}$ or more). In general, the dielectric loss becomes larger as the used frequency becomes higher, but in the dielectric ceramic of the invention, the dielectric loss in the GHz zone can be controlled to be small as mentioned above. This dielectric loss can be varied by not only the glass composition but also the inorganic filler. Accordingly, the dielectric loss can be adjusted by the composition, amount of the inorganic filler added when producing, and the sintering conditions such as the temperature. In the invention, as values for evaluating the dielectric characteristic in the high frequency, the dielectric characteristic values obtained in 3 GHz are made representative for measuring and evaluating the dielectric characteristic. A reason for selecting 3 GHz is because of being the zone frequently used in wireless LAN (for example, 2.4 to 2.5 GHz), and being easy to compare and appraise with existing products.

Further, it is possible that $\epsilon r$ in 1 to 15 GHz (especially 3 to 10 GHz) is 6 to 13 (further, 7 to 13, especially 9 to 13). In general, $\epsilon r$ becomes lower as the used frequency becomes higher. If this $\epsilon r$ is too small, it is necessary to obtain the dielectric ceramic large so much for using it in the GHz zone, and accordingly miniaturization is difficult. Therefore, taking use in the GHz zone into consideration, $\epsilon r$ is preferably large, so that miniaturization of various kinds of electronic parts is available also for using in the GHz zone.

It is possible that $\tau f$ (temperature range: 25 to 80° C.) in 1 to 15 GHz (especially, 3 to 10 GHz) is −20 to 10 ppm/° C.

(further, −10 to 10 ppm/° C., especially −10 to 5 ppm/° C.). In general, the absolute value of temperature coefficient of resonance frequency becomes large to a negative side as the used frequency becomes higher. If the absolute value is large to the negative side, when using as a package substrate, it is difficult to support a band-pass filter therein, and electric reliability reduces. Therefore, taking use in the GHz zone into consideration, the absolute value of τf is preferably small, so that various kinds of electronic parts is stable in operation also for using in the GHz zone.

Further, it is possible that the coefficient of thermal expansion heightening from 25° C. to 400° C. is 5 to 10 ppm/° C. In general, the coefficient of thermal expansion of printed wire substrates served in recent years is about 13 to 14 ppm/° C., and the coefficient of thermal expansion of semiconductor parts as IC is about 3 to 4 ppm/° C. If using the dielectric ceramic as the multi-wire substrate, it is necessary to have a coefficient of thermal expansion nearer to both of the coefficient of thermal expansion of the printed wire substrate and the coefficient of thermal expansion of the semiconductor parts, and the dielectric ceramic of the invention satisfies this requirement.

In addition, it is possible that the bending strength is 160 MPa or higher (further, 180 MPa or higher, especially 190 MPa or higher). If the bending strength is 160 MPa or higher, when dropping the multi-wire substrate or products of electronic parts made of the dielectric ceramic of the invention, breakage by shock can be subdued. The multi-wire substrate or the electronic parts are brazed with metals such as seal rings for electromagnetic-shielding, and it is possible to subdue breakage owing to thermal stress effected in this brazing process.

In the invention, the dielectric ceramic is available where the dielectric loss in 1 to 15 GHz (especially 3 to 10 GHz) is $50 \times 10^{-4}$ or lower, εr is 6 to 13, τf is −20 to 10 ppm/° C., the coefficient of thermal expansion at 25 to 400° C. is 5 to 10 ppm/° C., and the bending strength is 160 MPa or higher. Further, the dielectric ceramic is available where the dielectric loss in 1 to 15 GHz (especially 3 to 10 GHz) is $40 \times 10^{-4}$ or lower, εr is 7 to 13, τf is −10 to 10 ppm/° C., the coefficient of thermal expansion at 25 to 400° C. is 5 to 10 ppm/° C., and the bending strength is 180 MPa or higher.

Especially, if containing, as the inorganic filler, both of the gahnite filler and the titania filler, the dielectric ceramic is available where εr in 3 to 10 GHz is 9 to 13, τf is −15 to 0 ppm/° C., and the bending strength is 180 MPa. In addition, if both of the gahnite filler and the titania filler are contained and the total of these inorganic fillers and the glasses is 100 mass % such that the inorganic filler is 30 to 60 mass %, the dielectric ceramic is available where εr in 3 to 10 GHz is 10 to 13, τf is −15 to 0 pp m/C, and the bending strength is 190 MPa or higher.

If both of the gahnite filler and the titania filler are contained and the total of these inorganic fillers and the glasses is 100 mass % such that the inorganic filler is 30 to 60 mass % and mT/mG is 0.6 or higher, the dielectric ceramic is available where εr in 3 to 10 GHz is 10 to 13, τf is −3 to 0 ppm/° C., and the bending strength is 190 MPa or higher.

The dielectric loss, εr, τf, the coefficient of thermal expansion and the bending strength in the invention depend on the same methods as measuring methods in layer mentioned Examples.

The method for obtaining the dielectric ceramic of the invention is not especially limited, and for example, the following methods may be employed. That is, in case the glass in one embodiment of the invention contains the alkali metal element, the composition of the dielectric ceramic is obtained by compounding the inorganic filler powders and the glass powders, and is sintered at 1000° C. or lower, wherein in case the whole of the glass powders is 100 mass %, in terms of oxides respectively, Si: 20 to 30 mass %, B: 5 to 30 mass %, Al: 20 to 30 mass %, Ca: 10 to 20 mass %, Zn: 10 to 20 mass %, and at least one kind of alkali metal: 0.2 to 5 mass % in total of Li, Na and K, and in case the total of the inorganic filler powders and the glass powders is 100 mass %, the inorganic filler powder is 20 to 60 mass % and the glass powder is 40 to 80 mass %.

On the other hand, in case the glass in one embodiment of the invention does not contain the alkali metal elements, the composition of the dielectric ceramic is obtained by compounding the inorganic filler powders and the glass powders, and is sintered at 1000° C. or lower, wherein in case the whole of the glass powders is 100 mass %, in terms of oxides respectively, Si: 20 to 30 mass %, B: 5 to 30 mass %, Al: 20 to 30 mass %, Ca: 10 to 20 mass %, Zn: 10 to 20 mass %, and alkali metal containing neither Li, Na nor K, and in case the total of the inorganic filler powders and the glass powders is 100 mass %, the inorganic filler powder is 20 to 60 mass % and the glass powder is 40 to 80 mass %.

As the above mentioned inorganic filler powders in this production method, there are respective powders of titania, alumina and zirconia which are made powders by sintering. They may be used sole or in combination.

No especial limitation is made to diameter of the inorganic filler powder, and 1 to 10 μm is preferable. Being large over 10 μm, the structure of the dielectric ceramic exceedingly become rough. Being less than 1 μm, a time taken for pulverizing is long, and handling is difficult.

All the amount of the inorganic filler powders are not necessary to exist as the inorganic filler in the dielectric ceramic, and it is sufficient that parts of powders are melted into the glass and exist as the glass.

The glass powder is obtained in that, for example, raw material powders mixed to have the above composition are heated and melted, rapidly cooled into frits, and the frits are pulverized. The amount of each of elements contained in the glass powders has the same reason as that of the amount of the glass contained in the dielectric ceramic.

No especial limitation is made to the diameter of the glass powder. Normally, it may be 1 to 10 μm. Being over 10 μm, undesirable influences might happen when forming into sheets, and being less than 1 μm, the time taken for pulverizing is long, and the handling is difficult.

All the amount of the glass powders are not necessary to exist as the glass in the dielectric ceramic, and it is sufficient that parts of the powders are precipitated in the dielectric ceramic and thereby exist as the glass.

The glass transition point Tg of the glass powder is not especially limited, but preferably 560 to 670° C. (more preferably 570 to 660° C., and still more preferably 570 to 640° C.). Being within this range, it is possible to keep favorable the simultaneously sintering property with the low resistant conductor such as Ag based metals (single Ag, Ag/Pd alloy, Ag/Pt alloy, Ag/Cu alloy, or Ag/Au alloy, etc.) or Cu based metals (single Cu containing small amounts of other elements), and the warp caused by sintering can be effectively subdued.

A bending point Mg (i.e., a softening point on a thermal expansion curve (DTA curve), which is a temperature where expansion stops and shrinkage starts apparently; sometimes referred to as At) of the glass powder is not especially limited, and it is desirable that difference in temperature from the glass transition point Tg is 30 to 45° C. (more preferably 30 to 40° C., still for preferably 30 to 38° C.). If the difference in temperature between Tg and Mg is within this range, dispersion in shrinkage caused by sintering can be effectively suppressed. Accordingly, electronic parts or wire substrates can be designed at high dimensional precision.

As to the mixing rate of the inorganic filler powder and the glass powder in the composition for the dielectric ceramic, for the same reason as that of the dielectric ceramic, it is desirable to mix them such that the inorganic filler powder is 30 to 60 mass % (the glass powder is 40 to 70 mass %). It is desirable to mix them such that the inorganic filler filler powder is 40 to 60 mass % (the glass powder is 40 to 60 mass %), and more desirably 45 to 55 mass % (the glass powder is 45 to 55 mass %).

The composition for the dielectric ceramic may be composed of the inorganic filler powders and the glass powders, and other than them, may contain, e.g., a binder, solvent, plasticizer and dispersant. No especial limitation is made to properties of the composition for the dielectric ceramic, for example, powder, slurry and paste are sufficient. Further, the composition for the dielectric ceramic may be formed of these powder, slurry and paste through various kinds of forming methods (powder: pressed powder, CIP or HIP; slurry and paste: a doctor blade process, screen printing process and press forming process).

The sintering is preferably carried out at 1000° C. or lower (ordinarily 750° C. or higher, more preferably 800 to 990° C., still more preferably 850 to 990° C., especially preferably 900 to 980° C.). Being at higher than 1000° C., the simultaneously sintering with many low resistant conductors is undesirably difficult.

EXAMPLES

The invention will be specifically explained, referring to Examples.

[1 The Dielectric Ceramic Using the Glasses Containing Alkali Metal Element and not Containing the Gahnite Filler
(1) Preparation of the Glass Powders Other than powders of $SiO_2$, $B_2O_3$, $Al_2O_3$, CaO, ZnO, $Na_2CO_3$ and $K_2CO_3$, powders of MgO, BaO, SrO and ZrO were mixed at the ratios shown in Table 1 to prepare the raw material powders. The prepared raw material powders were heated to melt, thrown into a water to rapidly cool, and simultaneously granulated in the water to obtain glass frits. The glass frits were pulverized in a ball mill to produce 10 kinds of glass powders (Glass Nos. 1 to 10) of average diameter being 3 μm.

TABLE 1

| | | Dielectric ceramic | | | | | | | | | | |
| | | Glasses | | | | | | | | | | Inorganic filler |
| | | Composition (Mass %) | | | | | | | | | | |
| | Glass | | | | | | Alkali | Others | | | | Alumina |
| A | No. | $SiO_2$ | $B_2O_3$ | $Al_2O_3$ | CaO | ZnO | metals | MgO | BaO | SrO | $ZrO_2$ | (Mass %) | (Mass %) |
|---|---|---|---|---|---|---|---|---|---|---|---|---|---|
| 1 | 1 | 20 | 25.8 | 24 | 16 | 11 | 3.2 $Na_2O$ | — | | | | 50 | 50 |
| 2 | 2 | 20 | 24 | 24 | 16 | 11 | 3 $Na_2O$ 2 $K_2O$ | — | | | | | |
| *3 | *3 | 28.5 | *45.5 | *9 | *— | *— | *— | — | 17 | | — | | |
| *4 | *4 | 75 | 17 | *5.6 | *— | *— | 1.1 $Na_2O$ | | — | | 1.3 | | |
| *5 | *5 | 25 | *36 | *3.3 | *0.15 | *— | *— | — | 35 | 0.5 | 0.05 | | |
| *6 | *6 | *35 | 8.6 | *19 | 17 | *— | 0.3 $K_2O$ | 0.4 | 19 | 0.7 | — | | |
| *7 | *7 | *32 | 24 | 25 | 16 | *— | *— | 3 | | | — | | |
| *8 | *8 | 22 | 22 | *8 | *— | 48 | *— | | — | | | | |
| *9 | *9 | *39 | 7.5 | 22 | 19 | 11 | 1.4 $Na_2O$ | 0.1 | | — | | | |
| *10 | *10 | *43 | 8 | 28 | *8 | *— | *— | 12 | | — | 1 | | |

A: Experimental examples
"*" in Table 1 designates "out of the range of the invention".

(2) Measurements of Tg and Mg of the Glass Powders

The 10 kinds of Tg and Mg of the glass powders produced in the above (1) were measured by a differential thermal measuring apparatus (Model "THERMOFLEX TAS 300 TG810D" made by Rigaku international Corporation), and the respective values of Tg, Mg and Mg-Tg are shown in Table 2.

TABLE 2

| | Heart characteristics of dielectric ceramic | | |
| Glass No. | Tg (° C.) | Mg (° C.) | Mg-Tg (° C.) |
|---|---|---|---|
| 1 | 576 | 611 | 35 |
| 2 | 580 | 613 | 33 |
| *3 | 535 | 650 | 115 |

TABLE 2-continued

| | Heat characteristics of dielectric ceramic | | |
|---|---|---|---|
| Glass No. | Tg (° C.) | Mg (° C.) | Mg-Tg (° C.) |
| *4 | 520 | 640 | 120 |
| *5 | 638 | 675 | 37 |
| *6 | 686 | 731 | 45 |
| *7 | 655 | 695 | 40 |
| *8 | 549 | 580 | 31 |
| *9 | 683 | 722 | 39 |
| *10 | 718 | 765 | 47 |

*in Table 2 designates "out of the range of the invention".

(3) Production of the Green Sheets (the Composition of the Dielectric Ceramic)

The 10 kinds of respective glass powders produced until the above (2) and alumina powders as the inorganic filler powders were so weighed as to respectively have the rates of 50 mass % as shown in Table 1, and were mixed in the ball mill to produce the mixed powders. The produced mixed powders were added with a binder (acrylicresin) a plasticizer [dibutylphthalate (DBP)] and a solvent (toluene), and mixed to prepare 10 kinds of slurries. The respective slurries were formed in sheet via doctor blade process such that thickness after sintering was 100 μm, so as to turn out 10 kinds of green sheets.

(4) Production of Ceramics for 1st Measurement (for Measuring the Dielectric Characteristic) and Measurement of the Dielectric Characteristic The 10 kinds of green sheets produced in the above (3) were punched into predetermined configurations, and the sheet pieces were piled by 10 sheets via thermo-compression bonding, and sintered at 900° C. for 15 minutes to produce ceramics. The ceramics were subjected to the polishing process into sheets of 50 mm×50 mm×0.635 mm, and the 10 kinds of ceramics for 1st measurement were produced. By use of the ceramics for 1st measurement, the dielectric loss and εr were measured at 25° C. in 3 GHz via a dielectric resonator-perturbation method of the dielectric ceramic. The results are shown in Table 3.

TABLE 3

| | Characteristics of dielectric ceramic | | |
|---|---|---|---|
| Experimental examples | Dielectric loss (×10$^{-4}$) (3 GHz) | δr (3 GHz) | Coefficient of thermal expansion (25–400° C.) (ppm/° C.) |
| 1 | 38 | 7.4 | 6.1 |
| 2 | 40 | 7.2 | 6.2 |
| *3 | 13 | 5.2 | 5.5 |
| *4 | 150 | 6.5 | 4.6 |
| *5 | 30 | 5.9 | 7.3 |
| *6 | 18 | 5.6 | 5.5 |
| *7 | 64 | 4.9 | 6.0 |
| *8 | 63 | 6.5 | 6.4 |
| *9 | 19 | 6.6 | 4.9 |
| *10 | 40 | 7.2 | 5.4 |

*in Table 3 designates "out of the range of the invention".

(5) Production of Ceramics for 2nd Measurement (for Measuring the Coefficient of Thermal Expansion) and Measurement of the Coefficient of Thermal Expansion The 10 kinds of green sheets produced in the above (3) were punched into predetermined configurations, and the sheet pieces were piled by 20 sheets via thermo-compression bonding, and sintered at 900° C. for 15 minutes to produce ceramics. The ceramics were subjected to the polishing process into columns of 3 mm×3 mm×1.6 mm, and the 10 kinds of ceramics for 2nd measurement were produced. By use of the ceramics for 2nd measurement, the coefficient of thermal expansion heightening from 25° C. to 400° C. was measured by a differential-expansion thermal machine-analyzing apparatus (Model "TMA8140D" made by Rigaku International Corporation). The results are shown in Table 3 together.

(6) Production of Ceramics for 3rd Measurement (for Measuring the Simultaneously Sintering Property) and Evaluation of the Simultaneously Sintering Property The 10 kinds of green sheets produced in the above (3) were printed with Ag paste of 15 μm thickness at predetermined positions thereof. On the Ag paste layer, other green sheets were laminated by the thermo-compression bonding, the Ag paste was similarly printed on the other green sheets, and by repeating this duty, the 5 green sheets were laminated, so that non-sintered laminations were obtained, which were printed with the Ag pastes in predetermined patterns between respective layers. The non-sintered laminations were punched into 4-cm diameter, and sintered 900° C. for 15 minutes. Thus, the 10 kinds of ceramics for the 3rd measurement arranged with the low resistant conductors were produced.

① Evaluation of Warps Caused by Sintering

The 10 kinds of the produced ceramics for 3rd measurement were laid quietly on a plane, and a difference between a maximum position from the plane and a minimum position (a contacting position with the plane) was measured, and if the difference was less than 50 μm (the warp to a degree of no practical matter) or no warp appeared, "⊚" was given, and "x" was given to the warp exceeding 50 μm and shown in Table 4, respectively.

② Ag-Migration by Sintering

The 10 kinds of produced ceramics for 3rd measurement were cut in the laminating direction, and the cut face was analyzed by EPMA (electronic probe micro-analyzer). As a result, among 6 those recognized in Ag-migration within the ceramics, the migration distance of less than 5 μm was "⊚", that of 5 to 10 was "o" and that of exceeding 10 μm was "x", and those are shown in Table 4 together.

TABLE 4

| | Characteristics of dielectric ceramic | | |
|---|---|---|---|
| Experimental examples | Ag migrations | Warp | Bending strength (MPa) |
| 1 | ⊚ | ⊚ | 210 |
| 2 | ⊚ | ⊚ | 260 |
| *3 | x | ⊚ | — |
| *4 | o | ⊚ | Less than 180 |
| *5 | x | x | — |
| *6 | o | x | — |
| *7 | x | ⊚ | — |
| *8 | ⊚ | x | — |

TABLE 4-continued

| | Characteristics of dielectric ceramic | | |
|---|---|---|---|
| Experimental examples | Ag migrations | Warp | Bending strength (MPa) |
| *9 | ◎ | x | — |
| *10 | x | x | — |

*in Table 4 designates "out of the range of the invention".

(7) Production of Ceramics for 4th Measurement (for Measuring Bending Strength) and Evaluation of Bending Strength Of the green sheets produced in the above (3), those corresponding to the experimental examples 1, 2 and 4 were punched into predetermined configurations, and the sheet pieces were piled by 10 sheets via thermo-compression bonding, and sintered at 900° C. for 15 minutes to produce ceramics. The ceramics were subjected to the polishing process into columns of 4 mm×3 mm×36 mm, and the 3 kinds of ceramics for 4th measurement were produced. By use of the ceramics for 4th measurement, and following JIS R 1601, the bending strength thereof (3-point bending) was measured. The results are shown in Table 4 together.

(8) Effects of the Experimental Examples 1 to 10

From the results of Tables 1 to 4, each of the experimental examples 3 to 10 can be sintered at low temperatures as 900° C., and can display the dielectric characteristics of a certain degree. But there are some caused with warps in the dielectric ceramic because of not good thermal characteristics of the glass powders, those not provided with enough dielectric characteristics, others generated with migration of the low resistant conductor by sintering, or still others not provided with enough bending strength. None of these experimental examples is well balanced with each of the sufficient characteristics. On the other hand, the experimental examples 1 and 2 of the inventive products could be simultaneously sintered with the low resistant conductor at 900° C., and show the dielectric characteristic of good values (dielectric loss: 38 to 40×10$^{-4}$, $\epsilon r$: 7.2 to 7.4, and bending strength: 210 to 260 MPa). Further, neither migration of components composing the low resistant conductor nor warp of the substrate are recognized, and it is seen that the sufficiently large bending strength is available. In addition, the coefficient of thermal expansion is 6.1 to 6.2 ppm/° C., and shows the suitable characteristic to be served as the wire substrate.

[2] The Dielectric Ceramic Using the Glasses Containing Alkali Metal Element and Containing the Gahnite Filler (1) Production of Ceramics for 5th Measurement (for Measuring the Dielectric Characteristic) and Measurement of the Dielectric Characteristic Using, as the glass powders, the glasses Nos. 1, 2, 4, 6 and 9 produced in the above [1], (1), and using, as the inorganic filler, the gahnite powders, titania powders and calcium titanate powders, those substances were combined and mixed at the rates shown in Table 5, and the green sheets were produced as in the above [1], (3). Subsequently, sintering similarly to the above [1], (4), and carrying out the polishing process, 11 kinds of ceramics for 5th measurement were produced. Among the produced dielectric ceramics, excepting the experimental example 11 bubbling while sintering and the experimental examples 19 to 21 caused with warps, and as to the rest 7 kinds, similarly to the above [1], (4), the relative dielectric constant $\epsilon r$ in 3 GHz and the temperature coefficient τf of resonance frequency at 25 to 80° C. were measured. The results are shown in Table 5 together.

TABLE 5

| | Dielectric ceramic | | | | | | | | | |
|---|---|---|---|---|---|---|---|---|---|---|
| | Glasses | | Inorganic filler | | | | | Characteristics of dielectric ceramic | | | |
| | Glass | | Kind - Proportion (Mass) | | | | | $\epsilon r$ | τf | | B |
| A | No. | (Mass %) | Gahnite | Titania | Others | mT/mG | (Mass %) | (3 GHz) | (ppm/° C.) | Warp | (MPa) |
| *11 | 1 | *85 | 8 | 7 | — | 0.86 | *15 | Bubbling when sintering | | | |
| 12 | 1 | 79 | 11 | 10 | | 0.91 | 21 | 9.7 | −9 | ◎ | 180 |
| 13 | 1 | 59 | 24 | 17 | | 0.71 | 41 | 10.6 | −1 | ◎ | 190 |
| 14 | 1 | 56 | 25 | 19 | | 0.76 | 44 | 10.6 | 1 | ◎ | 192 |
| 15 | 1 | 53 | 27 | 20 | | 0.74 | 47 | 10.3 | −3 | ◎ | 190 |
| 16 | 1 | 53 | 33 | 14 | | 0.42 | 47 | 9.5 | −15 | ◎ | 220 |
| 17 | 1 | 54 | 26 | — | CaTiO$_3$ 20 | — | 46 | 11.2 | 7 | ◎ | 165 |
| 18 | 2 | 53 | 27 | 20 | | 0.74 | 47 | 10.7 | −3 | ◎ | 190 |
| *19 | *4 | | | | | | | | | | |
| *20 | *6 | 57 | 25 | 18 | | 0.72 | 43 | — | — | x | — |
| *21 | *9 | | | | | | | | | | |

A: Experimental examples
B: Bending resistant strength
"*" in Table 5 designates "out of the range of the invention".

(2) Production of Ceramics for 6th Measurement (for Measuring the Simultaneously Sintering Property) and Evaluation of the Simultaneously Sintering Property Similarly to the above [1], (6), the warps were measured, and in accordance with the same evaluating reference, "◎" or "x" are shown in Table 5.

(3) Production of Ceramics for 7th Measurement (for Measuring Bending Strength) and Evaluation of Bending Strength Except using the green sheets of the above [2], (1) where the ceramics without bubbling or warps in the above [2], (1)

and (2) could be produced, the 7 kinds of ceramics for 7th measurement were produced in the same manners as the above [1], (7). Then, following the same manner, the bending strength was measured, and the results are shown in Table 5 together.

(4) Effects of the Experimental Examples 11 to 21

From the results of Table 5, each of the experimental examples 12 to 18 could be sintered at low temperatures as 900° C. On the other hand, in the experimental example 11, since the ratio between the glass and the inorganic filler was out of the range of the invention, bubbles occurred during sintering, and the product in the experimental example 11 could not be served as the dielectric ceramic. In the experimental examples 19 to 21, warps occurred.

$\epsilon r$ in the case of the glass only is ordinarily about 6. In contrast, $\epsilon r$ of the dielectric ceramics (the experimental examples 12 to 16 and 18) of the inorganic filler being the gahnite filler and the titania filler could be made large as 9.5 to 10.7. Besides, $\tau f$ could have the small absolute values as −15 to 1 ppm/° C. On the other hands, also in the dielectric ceramic (the experimental example 17) of the inorganic filler being the gahnite filler and the calcium titanate filler, $\epsilon r$ could be made large as 11.2, and at the same time, $\tau f$ could also have the small absolute values as 7 ppm/° C.

In the dielectric ceramic of the inorganic filler being the gahnite filler and the calcium titanate filler, the bending strength of 165 MPa could be provided. In particular, in the dielectric ceramics of the inorganic filler being the gahnite filler and the titania filler, the very excellent bending strength of 180 to 220 MPa could be provided.

In case the whole of the ceramic is 100 mass %, the gahnite filler and the titania filler are contained 41 to 47 mass % in total, and further in case mT/mG of the gahnite filler (mG) and the titania filler (mT) is 0.71 to 0.76, it is seen that the ceramic maintains the large $\epsilon r$ as 10.3 to 10.6; and $\tau f$ is subdued to be very small values as −3 to 1 ppm/° C. while maintaining the high bending strength as 190 to 192 MPa.

[3] The Dielectric Ceramic Using the Glasses not Containing Alkali Metal Element, and not Containing the Gahnite Filler (1) Preparation of the Glass Powders Other than powders of $SiO_2$, $B_2O_3$, $Al_2O_3$, CaO, and ZnO, powders of MgO, BaO, SrO and $ZrO_2$ were mixed at the ratios shown in Table 6 to prepare the raw material powders. The prepared raw material powders were heated to melt, thrown into the water to rapidly cool, and simultaneously granulated in the water to obtain glass frits. The glass frits were pulverized in a ball mill to produce 11 kinds of glass powders (Glass Nos. 1 to 11) of average diameter being 3 μm.

TABLE 6

| | | Dielectric ceramic | | | | | | | | | | |
|---|---|---|---|---|---|---|---|---|---|---|---|---|
| | | Glasses | | | | | | | | | | Inorganic filler |
| | | Composition (Mass %) | | | | | | | | | | |
| | Glass | | | | | | Alkali | Others | | | | Alumina |
| A | No. | $SiO_2$ | $B_2O_3$ | $Al_2O_3$ | CaO | ZnO | metals | MgO | BaO | SrO | $ZrO_2$ | (Mass %) | (Mass %) |
| 1 | 1 | 20 | 26 | 25 | 17 | 12 | — | — | | | | 50 | 50 |
| 2 | 2 | 22 | 21 | 26 | 28 | 13 | — | — | | | | | |
| 3 | 3 | 25 | 21 | 25 | 17 | 12 | — | — | | | | | |
| *4 | *4 | 28.5 | *45.5 | *9 | *— | *— | *— | — | 17 | | — | | |
| *5 | *5 | 75 | 17 | *5.6 | *— | *— | 1.1 $Na_2O$ | — | | | 1.3 | | |
| *6 | *6 | 25 | *36 | *3.3 | *0.15 | *— | *— | — | 35 | 0.5 | 0.05 | | |
| *7 | *7 | *35 | 8.6 | *19 | 17 | *— | 0.3 $K_2O$ | 0.4 | 19 | 0.7 | — | | |
| *8 | *8 | *32 | 24 | 25 | 16 | *— | *— | 3 | | | — | | |
| *9 | *9 | 22 | 22 | *8 | *— | 48 | *— | | | | | | |
| *10 | *10 | *39 | 7.5 | 22 | 19 | 11 | 1.4 $Na_2O$ | 0.1 | | | — | | |
| *11 | *11 | *43 | 8 | 28 | *8 | *— | *— | 12 | | | 1 | | |

A: Experimental examples
"*" in Table 6 designates "out of the range of the invention".

(2) Measurements of Tg and Mg of the Glass Powders

The 11 kinds of Tg and Mg of the glass powders produced in the above (1) were measured by the differential thermal measuring apparatus (Model "THERMOFLEX TAS 300 TG810D" made by Rigaku International Corporation), and the respective values of Tg, Mg and Mg-Tg are shown in Table 7.

TABLE 7

| | Heat characteristics of glass | | |
|---|---|---|---|
| Glass No. | Tg (° C.) | Mg (° C.) | Mg-Tg (° C.) |
| 1 | 623 | 657 | 34 |
| 2 | 631 | 671 | 40 |
| 3 | 631 | 671 | 40 |
| *4 | 535 | 650 | 115 |
| *5 | 520 | 640 | 120 |
| *6 | 638 | 675 | 37 |
| *7 | 686 | 731 | 45 |
| *8 | 655 | 695 | 40 |
| *9 | 549 | 580 | 31 |
| *10 | 683 | 722 | 39 |
| *11 | 718 | 765 | 47 |

*in Table 7 designates "out of the range of the invention".

(3) Production of the Green Sheets (the Composition of the Dielectric Ceramic)

The 11 kinds of respective glass powders produced until the above (2) and alumina powders as the inorganic filler powders were so weighed as to respectively have the rates of 50 mass % as shown in Table 6, and were mixed in the ball mill to produce the mixed powders. The produced mixed powders were added with the binder (acrylic resin), the plasticizer (dibutyl phthalate (DBP)) and the solvent (toluene), and mixed to prepare 11 kinds of slurries. The respective slurries were formed in sheet via doctor blade process such that thickness after sintering was 100 μm, so as to turn out 11 kinds of green sheets.

(4) Production of Ceramics for 1st Measurement (for Measuring the Dielectric Characteristic) and Measurement of the Dielectric Characteristic The 11 kinds of green sheets produced in the above (3) were punched into predetermined configurations, and the sheet pieces were piled by 11 sheets via thermo-compression bonding, and sintered at 900° C. for 15 minutes to produce ceramics. The ceramics were subjected to the polishing process into sheets of 50 mm×50 mm×0.635 mm, and the 11 kinds of ceramics for 1st measurement were produced. By use of the ceramics for 1st measurement, the dielectric loss and εr were measured at 25° C. in 3 GHz via the resonator-perturbation method of the dielectric ceramic. The results are shown in Table 8.

TABLE 8

| | Characteristics of dielectric ceramic | | | | |
|---|---|---|---|---|---|
| Experimental examples | Dielectric loss (×10⁻⁴) (3 GHz) | εr (3 GHz) | Coefficient of thermal expansion (25–400° C.) (ppm/° C.) | Warp | Bending strength (MPa) |
| 1 | 39 | 7.5 | 5.4 | ◎ | 260 |
| 2 | 30 | 7.6 | 5.4 | ◎ | 270 |
| 3 | 30 | 7.6 | 5.3 | ◎ | 270 |
| *4 | 13 | 5.2 | 5.5 | ◎ | — |
| *5 | 150 | 6.5 | 4.6 | ◎ | Less than 180 |
| *6 | 30 | 5.9 | 7.3 | ◎ | — |
| *7 | 18 | 5.6 | 5.5 | x | — |
| *8 | 64 | 4.9 | 6.0 | ◎ | — |
| *9 | 63 | 6.5 | 6.4 | x | — |
| *10 | 19 | 6.6 | 4.9 | x | — |
| *11 | 40 | 7.2 | 5.4 | x | — |

*in Table 8 designates "out of the range of the invention".

(5) Production of Ceramics for 2nd Measurement (for Measuring the Coefficient of Thermal Expansion) and Measurement of the Coefficient of Thermal Expansion The 11 kinds of green sheets produced in the above (3) were punched into predetermined configurations, and the sheet pieces were piled by 20 sheets via thermo-compression bonding, and sintered at 900° C. for 15 minutes to produce ceramics. The ceramics were subjected to the polishing process into columns of 3 mm×3 mm×1.6 mm, and the 11 kinds of ceramics for 2nd measurement were produced. By use of the ceramics for 2nd measurement, the coefficient of thermal expansion heightening from 25° C. to 400° C. was measured by the differential-expansion thermal machine-analyzing apparatus (Model "TMA140D" made by Rigaku International Corporation) The results are shown in Table 8 together.

(6) Production of Ceramics for 3rd Measurement (for Measuring the Simultaneously Sintering Property) and Evaluation of the Simultaneously Sintering Property The 11 kinds of green sheets produced in the above (3) were printed with Ag paste of 15 μm thickness at predetermined positions thereof. On the Ag paste layer, other green sheets were laminated by the thermo-compression bonding, the Ag paste was similarly printed on the other green sheets, and by repeating this duty, the 5 green sheets were laminated, so that non-sintered laminations were obtained, which were printed with the Ag pastes in predetermined patterns between respective layers. The non-sintered laminations were punched into 4-cm diameter, and sintered 900° C. for 15 minutes. Thus, the 11 kinds of ceramics for the 3rd measurement arranged with the low resistant conductors were produced.

The 11 kinds of produced ceramics for 3rd measurement were laid quietly on the plane, and a difference between a maximum position from the plane and a minimum position (a contacting position with the plane) was measured, and if the difference was less than 50 m (the warp to a degree of no practical matter) or no warp appeared, "◎" was given, and "x" was given to the warp exceeding 50 μm and shown in Table 8.

(7) Production of Ceramics for 4th Measurement (for Measuring Bending Strength) and Evaluation of Bending Strength Of the green sheets produced in the above (3), those corresponding to the experimental examples 1, 2, 3 and 4 were punched into predetermined configurations, and the sheet pieces were piled by 11 sheets via thermo-compression bonding, and sintered at 900° C. for 15 minutes to produce ceramics. The ceramics were subjected to the polishing process into columns of 4 mm×3 mm×36 mm, and the 3 kinds of ceramics for 4th measurement were produced. By use of the ceramics for 4th measurement, the bending strength thereof (3-point bending) was measured. The results are shown in Table 8 together.

(8) Effects of the Experimental Examples 1 to 10

From the results of Tables 6 to 8, each of the experimental examples 4 to 11 can be sintered at low temperatures as 900° C., and can display the dielectric characteristic of a certain degree. But there are some caused with warps in the dielectric ceramic because of not good thermal characteristic of the glass powders, those not provided with enough dielectric characteristic, others generated with migration of the low resistant conductor by sintering, or still others not provided with enough bending strength. None of these experimental examples is well balanced with each of the sufficient characteristics. On the other hand, the experimental examples 1 to 3 of the inventive products could be simultaneously sintered with the low resistant conductor at 900° C., and show the dielectric characteristic of good values (dielectric loss: 30 to 39×10⁻⁴, εr: 7.5 to 7.6, and bending strength: 260 to 270 MPa). Further, neither migration of components composing the low resistant conductor nor warp of the substrate are recognized, and it is seen that the sufficiently large bending strength is available. In addition, the coefficient of thermal expansion is 5.3 to 5.4 ppm/° C., and shows the suitable characteristics to be served as the wire substrate.

[4] The Dielectric Ceramic Using the Glasses not Containing Alkali Metal Element, and Containing the Gahnite Filler (1) Production of Ceramics for 5th Measurement (for Measuring the Dielectric Characteristic) and Measurement of the Dielectric Characteristic Using, as the glass powders, the glasses Nos. 1, 2, and 3 produced in the above (1], (1), and using, as the inorganic filler, the gahnite powders, titania powders and calcium titanate powders, those substances were combined and mixed at the rates shown in Table 9, and the green sheets were produced as in the above [1], (3). Subsequently, sintering similarly to the above [1], (4), and carrying out the polishing process, 9 kinds of ceramics for 5th measurement were produced. Among the produced dielectric ceramics, excepting the experimental example 12 bubbling while sintering, as to the rest 8 kinds, similarly to the above [1], (4), the relative dielectric constant ∈r in 3 GHz and the temperature coefficient τf of resonance frequency at 25 to 80° C. were measured. The results are shown in Table 9 together.

inorganic filler being the gahnite filler and the calcium titanate filler, ∈r could be made large as 10.7, and at the same time, τf could also have the small absolute values as 7 ppm/° C.

In the dielectric ceramic of the inorganic filler being the gahnite filler and the calcium titanate filler, the bending strength of 165 MPa could be provided. In particular, in the dielectric ceramics of the inorganic filler being the gahnite filler and the titania filler, the very excellent bending strength as 180 to 220 MPa could be provided.

In case the whole of the ceramic is 100 mass %, the gahnite filler and the titania filler are contained 41 to 47 mass

TABLE 9

| | | Composition of dielectric ceramic | | | | | Characteristics of dielectric ceramic | | | |
|---|---|---|---|---|---|---|---|---|---|---|
| | | Glasses | Inorganic filler | | | | | | | |
| | | Glass | Kind - Proportion (Mass %) | | | | ∈r | τf | | B |
| A | No. | (Mass %) | Gahnite | Titania | Others | mT/mG | (Mass %) | (3 GHz) | (ppm/° C.) | Warp | (MPa) |
| *12 | 1 | *85 | 8 | 7 | — | 0.86 | *15 | Bubbling when sintering | | | |
| 13 | 1 | 79 | 11 | 10 | | 0.91 | 21 | 9.5 | −8 | ⊚ | 180 |
| 14 | 1 | 59 | 24 | 17 | | 0.71 | 41 | 10.4 | −3 | ⊚ | 192 |
| 15 | 1 | 56 | 25 | 19 | | 0.76 | 44 | 10.4 | −2 | ⊚ | 193 |
| 16 | i | 53 | 27 | 20 | | 0.74 | 47 | 10.1 | −5 | ⊚ | 190 |
| 17 | 1 | 53 | 33 | 14 | | 0.42 | 47 | 9.3 | −16 | ⊚ | 222 |
| 18 | 1 | 54 | 26 | — | CaTiO$_3$ 20 | — | 46 | 10.7 | 7 | ⊚ | 165 |
| 19 | 2 | 58 | 24 | 18 | | 0.75 | 42 | 10.5 | −5 | ⊚ | 190 |
| 20 | 3 | | | | | | | 10.1 | −4 | ⊚ | 191 |

A: Experimental examples
B: Bending resistant strength
"*" in Table 9 designates "out of the range of the invention".

(2) Production of Ceramics for 6th Measurement (for Measuring the Simultaneously Sintering Property) and Evaluation of the Simultaneously Sintering Property Similarly to the above [1], (6), the warps were measured, and in accordance with the same evaluating reference, "⊚" or "x" are shown in Table 9.

(3) Production of Ceramics for 7th Measurement (for Measuring Bending Strength) and Evaluation of Bending Strength Except using the green sheets of the above [2], (1) where the ceramics without bubbling in the above (21, (1) could be produced, the 8 kinds of ceramics for 6th measurement were produced in the same manners as the above [1], (7). Then, following the same manner, the bending strength was measured, and the results are shown in Table 9 together.

(4) Effects of the Experimental Examples 12 to 20

From the results of Table 9, each of the experimental examples 13 to 20 could be sintered at low temperatures as 900° C. On the other hand, in the experimental example 12, since the ratio between the glass and the inorganic filler was out of the range of the invention, bubbles occurred during sintering, and the product in the experimental example 11 could not be served as the dielectric ceramic.

∈r in the case of the glass only is ordinarily about 6. In contrast, ∈r of the dielectric ceramics (the experimental examples 13 to 17, 19 and 20) of the inorganic filler being the gahnite filler and the titania filler could be made large as 9.3 to 10.5. Besides, τf could have the small absolute values as −16 to −2 ppm/° C. On the other hands, also in the dielectric ceramic (the experimental example 18) of the % in total, and further in case mT/mG of the gahnite filler (mG) and the titania filler (mT) is 0.71 to 0.76, it is seen that the ceramic maintains the large ∈r as 10.1 to 10.4, and τf is subdued to be very small values as −5 to −2 ppm/° C. while maintaining the high bending strength as 190 to 193 MPa.

This application is based on Japanese patent applications JP 2002-145406, filed on May 20, 2002, JP 2002-145407, filed on May 20, 2002, JP 2002-145408, filed on May 20, 2002, JP 2002-145409, filed on May 20, 2002, JP 2001-232544, filed on Jul. 31, 2001, JP 2001-232545, filed on Jul. 31, 2001, JP 2001-232546, FILED ON Jul. 31, 2001, and JP 2001-232547, the entire contents of each of which are hereby incorporated by reference, the same as if set forth at length.

What is claimed is:

1. A dielectric ceramic comprising an inorganic filler and glass,
   wherein when the total amount of the inorganic filler and the glass is 100 weight %, the amount of the inorganic filler is 20 to 60 weight % and the amount of the glass is 40 to 80 weight %; and when the total amount of the glass is 100 weight %, the glass contains, each in terms of oxide, Si in amount of 20 to 30 weight %, B in an amount of 5 to 30 weight %, Al in an amount of 20 to 30 weight %, Ca in an amount of 10 to 20 weight %, Zn in amount of 10 to 20 weight %, and at least one alkali metal selected from Li, Na and K in a total amount of 0.2 to 5 weight %.

2. The dielectric ceramic according to claim 1, wherein the inorganic filler comprises a gahnite filler and a titania filler.

3. The dielectric ceramic according to claim 1, which has a dielectric loss in 3 GHz of $50 \times 10^{-4}$ or less.

4. The dielectric ceramic according to claim 1, which has a relative dielectric constant in 3 GHz of 6 to 13.

5. The dielectric ceramic according to claim 1, which has a coefficient of thermal expansion at 25 to 400° C. of 5 to 10 ppm/° C.

6. The dielectric ceramic according to claim 1, which has a bending strength is 185 MPa or more.

7. A dielectric ceramic comprising an inorganic filler and glass,
wherein when the total amount of the inorganic filler and the glass is 100 weight %, the amount of the inorganic filler is 20 to 60 weight % and the amount of the glass is 40 to 80 weight %; when the total amount of the glass is 100 weight %, the glass contains, each in terms of oxide, Si in amount of 20 to 30 weight %, B in an amount of 5 to 30 weight %, Al in an amount of 20 to 30 weight %, Ca in an amount of 10 to 20 weight %, and Zn in amount of 10 to 20 weight %; and the glass does not contain any of Li, Na and K.

8. The dielectric ceramic according to claim 7, wherein the inorganic filler comprises a gahnite filler and a titania filler.

9. The dielectric ceramic according to claim 7, which has a dielectric loss in 3 GHz of $50 \times 10^{-4}$ or less.

10. The dielectric ceramic according to claim 7, which has a relative dielectric constant in 3 GHz of 6 to 13.

11. The dielectric ceramic according to claim 7, which has a coefficient of thermal expansion at 25 to 400° C. of 5 to 10 ppm/° C.

12. The dielectric ceramic according to claim 7, which has a bending strength of 185 MPa or more.

13. A dielectric ceramic made by sintering at 1000° C. or lower a dielectric ceramic composition comprising an inorganic filler and glass,
wherein when the total amount of the inorganic filler and the glass is 100 weight %, the amount of the inorganic filler is 20 to 60 weight % and the amount of the glass is 40 to 80 weight %; and when the total amount of the glass is 100 weight %, the glass contains, each in terms of oxide, Si in amount of 20 to 30 weight %, B in an amount of 5 to 30 weight %, Al in an amount of 20 to 30 weight %, Ca in an amount of 10 to 20 weight %, Zn in amount of 10 to 20 weight %, and at least one alkali metal selected from Li, Na and K in a total amount of 0.2 to 5 weight %.

14. The dielectric ceramic according to claim 13, wherein the inorganic filler comprises a gahnite filler and a titania filler.

15. The dielectric ceramic according to claim 13, wherein a glass transition point Tg is 560 to 670° C.

16. The dielectric ceramic according to claim 15, wherein the inorganic filler comprises a gahnite filler and a titania filler.

17. The dielectric ceramic according to claim 15, which has a glass transition point Tg of 560 to 670° C.

18. The dielectric ceramic according to claim 15, which has a difference between a glass transition point Tg and a bending point Mg is 30 to 45° C.

19. The dielectric ceramic according to claim 15, which has a dielectric loss in 3 GHz of $50 \times 10^{-4}$ or less.

20. The dielectric ceramic according to claim 15, which has a relative dielectric constant in 3 GHz of 6 to 13.

21. The dielectric ceramic according to claim 15, which has a coefficient of thermal expansion at 25 to 400° C. of 5 to 10 ppm/° C.

22. The dielectric ceramic according to claim 13, which has a difference in temperature between a glass transition point Tg and a bending point Mg is 30 to 45° C.

23. The dielectric ceramic according to claim 13, which has a dielectric loss in 3 GHz of $50 \times 10^{-4}$ or less.

24. The dielectric ceramic according to claim 13, which has a relative dielectric constant in 3 GHz of 6 to 13.

25. The dielectric ceramic according to claim 13, which has a coefficient of thermal expansion at 25 to 400° C. of 5 to 10 ppm/° C.

26. The dielectric ceramic according to claim 13, which has a bending strength of 185 MPa or more.

27. The dielectric ceramic according to claim 13, which has a bending strength of 185 MPa or more.

28. A dielectric ceramic made by sintering at 1000° C. or lower a dielectric ceramic composition comprising an inorganic filler and glass,
wherein when the total amount of the inorganic filler and the glass is 100 weight %, the amount of the inorganic filler is 20 to 60 weight % and the amount of the glass is 40 to 80 weight %; when the total amount of the glass is 100 weight %, the glass contains, each in terms of oxide, Si in amount of 20 to 30 weight %, B in an amount of 5 to 30 weight %, Al in an amount of 20 to 30 weight %, Ca in an amount of 10 to 20 weight %, and Zn in amount of 10 to 20 weight %; and the glass does not contain any of Li, Na and K.

29. The dielectric ceramic according to claim 28, wherein the inorganic filler comprises a gahnite filler and a titania filler.

30. The dielectric ceramic according to claim 28, which has a glass transition point Tg of 560 to 670° C.

31. The dielectric ceramic according to claim 30, wherein the inorganic filler comprises a gahnite filler and a titania filler.

32. The dielectric ceramic according to claim 30, which has a difference in temperature between the glass transition point Tg and a bending point Mg of 30 to 45° C.

33. The dielectric ceramic according to claim 30, which has a dielectric loss in 3 GHz of $50 \times 10^{-4}$ or less.

34. The dielectric ceramic according to claim 30, which has a relative dielectric constant in 3 GHz of 6 to 13.

35. The dielectric ceramic according to claim 30, which has a coefficient of thermal expansion at 25 to 400° C. of 5 to 10 ppm/° C.

36. The dielectric ceramic according to claim 30, which has a bending strength of 185 MPa or more.

37. The dielectric ceramic according to claim 28, which has a difference in temperature between a glass transition point Tg and a bending point Mg is 30 to 45° C.

38. The dielectric ceramic according to claim 28, which has a dielectric loss in 3 GHz of $50 \times 10^{-4}$ or less.

39. The dielectric ceramic according to claim 28, which has a relative dielectric constant in 3 GHz of 6 to 13.

40. The dielectric ceramic according to claim 28, which has a coefficient of thermal expansion at 25 to 400° C. of 5 to 10 ppm/° C.

41. The dielectric ceramic according to claim 28, which has a bending strength of 185 MPa or more.

* * * * *